(12) United States Patent
Yamamoto et al.

(10) Patent No.: US 12,538,432 B2
(45) Date of Patent: Jan. 27, 2026

(54) PRINTED WIRING BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Masamichi Yamamoto, Osaka (JP); Kayo Hashizume, Osaka (JP); Issei Okada, Osaka (JP); Kenichiro Aikawa, Shiga (JP); Yoshio Oka, Osaka (JP)

(73) Assignees: Sumitomo Electric Industries, Ltd., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 216 days.

(21) Appl. No.: 18/681,035

(22) PCT Filed: May 26, 2022

(86) PCT No.: PCT/JP2022/021565
§ 371 (c)(1),
(2) Date: Feb. 3, 2024

(87) PCT Pub. No.: WO2023/013213
PCT Pub. Date: Feb. 9, 2023

(65) Prior Publication Data
US 2024/0251508 A1     Jul. 25, 2024

(30) Foreign Application Priority Data
Aug. 6, 2021   (JP) .................. 2021-129871

(51) Int. Cl.
*H05K 3/10*     (2006.01)
*H05K 1/03*     (2006.01)
(Continued)

(52) U.S. Cl.
CPC .......... *H05K 3/107* (2013.01); *H05K 1/0346* (2013.01); *H05K 1/09* (2013.01); *H05K 3/181* (2013.01);
(Continued)

(58) Field of Classification Search
CPC .......... H05K 3/107; H05K 1/09; H05K 3/181; H05K 3/188
See application file for complete search history.

(56) References Cited

U.S. PATENT DOCUMENTS 8,072,052 B2 * 12/2011 Ko .................... H01L 23/49827
                                                      257/668
2013/0192881 A1 * 8/2013 Lee ........................ H05K 3/108
                                                      174/251

FOREIGN PATENT DOCUMENTS

JP        62-243390 A      10/1987
JP        2009-81209 A      4/2009
(Continued)

*Primary Examiner* — Sherman Ng
(74) *Attorney, Agent, or Firm* — Renner, Otto, Boisselle & Sklar, LLP

(57) ABSTRACT

A printed wiring board includes a base film having a first major surface provided with a groove, and a wiring line disposed in the groove. The wiring line includes a metal particle layer disposed at least on a bottom surface of the groove and a plating layer disposed on the metal particle layer. The metal particle layer contains a plurality of metal particles bonded to each other by metallic bonding. A surface of each of the plurality of metal particles is partially coated with an organic film.

14 Claims, 15 Drawing Sheets

(51) Int. Cl.
*H05K 1/09* (2006.01)
*H05K 3/18* (2006.01)

(52) U.S. Cl.
CPC ..... *H05K 3/188* (2013.01); *H05K 2201/0154* (2013.01); *H05K 2201/2081* (2013.01)

(56) References Cited

FOREIGN PATENT DOCUMENTS

| | | | |
|---|---|---|---|
| JP | 2009-081212 | A | 4/2009 |
| JP | 2012-244009 | A | 12/2012 |

* cited by examiner

PRINTED WIRING BOARD

TECHNICAL FIELD

The present disclosure relates to a printed wiring board. This application claims priority based on Japanese Patent Application No. 2021-129871 filed on Aug. 6, 2021, and the entire contents of the Japanese patent application are incorporated herein by reference.

BACKGROUND ART

Japanese Unexamined Patent Application Publication No. 2009-81212 (PTL 1) describes a printed wiring board. The printed wiring board described in PTL 1 includes a base material, a plating core, and a circuit.

The base material has a first major surface and a second major surface opposite to the first major surface. Grooves are formed in the first major surface. The groove extends in a direction toward the second major surface in a cross-sectional view. The plating cores are adhered to the inner surface of the groove. The circuit is an electroless plating layer and is provided in the groove.

CITATION LIST

Patent Literature

PTL 1: Japanese Unexamined Patent Application Publication No. 2009-81212

SUMMARY OF INVENTION

A printed wiring board of the present disclosure includes a base film having a first major surface provided with a groove, and a wiring line disposed in the groove. The wiring line includes a metal particle layer disposed at least on a bottom surface of the groove and a plating layer disposed on the metal particle layer. The metal particle layer contains a plurality of metal particles bonded to each other by metallic bonding. A surface of each of the plurality of metal particles is partially coated with an organic film.

DETAILED DESCRIPTION

Figure 1:
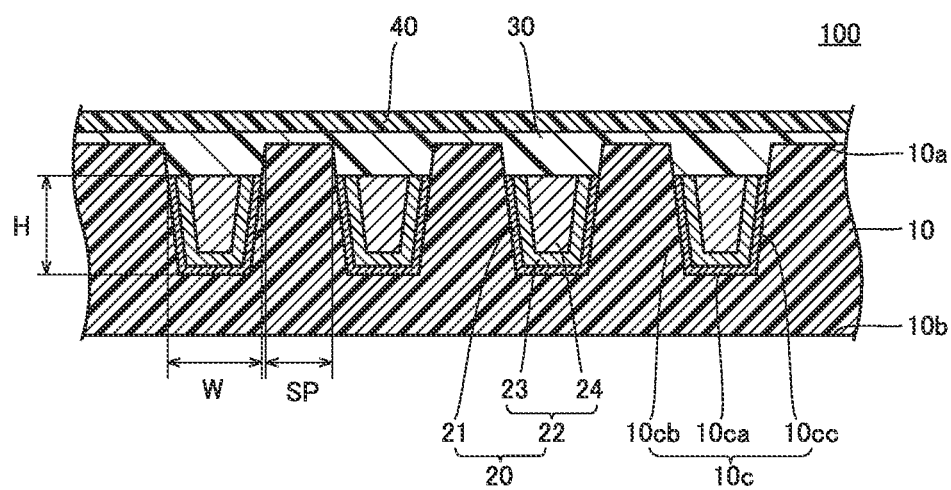
FIG. 1 is a cross-sectional view of a printed wiring board 100.

Problems to be Solved by Present Disclosure

In the printed wiring board described in PTL 1, the circuit may be oxidized at an interface with the inner surface of the groove. Further, when the circuit is oxidized at the interface with the inner surface of the groove, the circuit may be peeled off from the groove.

The present disclosure has been made in view of the above-described problems of the prior art. More specifically, the present disclosure provides a printed wiring board capable of suppressing oxidation of the wiring line at the interface with the groove.

Advantageous Effect of the Present Disclosure

According to the printed wiring board of the present disclosure, it is possible to suppress oxidation of the wiring line at the interface with the groove.

Description of Embodiments

First, embodiments of the present disclosure will be listed and described.

(1) A printed wiring board according to an embodiment includes a base film having a first major surface provided with a groove, and a wiring line disposed in the groove. The wiring line includes a metal particle layer disposed at least on a bottom surface of the groove and a plating layer disposed on the metal particle layer. The metal particle layer contains a plurality of metal particles bonded to each other by metallic bonding. A surface of each of the plurality of metal particles is partially coated with an organic film.

According to the printed wiring board of the above (1), it is possible to suppress oxidation of the wiring line at the interface with the groove.

(2) In the printed wiring board according to the above (1), the metal particle layer may be disposed on the bottom surface of the groove and a side surface of the groove.

(3) In the printed wiring board according the above to (1) or (2), the plurality of metal particles may be made of copper.

(4) In the printed wiring board according to the above (1) or (2), the plurality of metal particles may be made of silver.

According to the printed wiring board of the above (4), it is possible to further suppress oxidation of the wiring line at the interface with the groove.

(5) In the printed wiring board according to any one of the above (1) to (4), the organic film may be made of a polymeric material having a number-average molecular weight of 100 to 1000000.

According to the printed wiring board of the above (5), it is possible to suppress the metal particle layer from becoming porous while ensuring the oxidation suppressing function of the metal particle layer.

(6) In the printed wiring board according to any one of the above (1) to (5), a d50 of the plurality of metal particles may be 1 nm to 500 nm.

(7) In the printed wiring board according to any one of the above (1) to (6), the plating layer may include an electroless plating layer disposed on the metal particle layer and an electrolytic plating layer disposed on the electroless plating layer.

(8) In the printed wiring board according to any one of the above (1) to (6), the plating layer may include an electrolytic plating layer disposed on the metal particle layer.

According to the printed wiring board of the above (8), since the step of forming the electroless plating layer can be omitted, the manufacturing step can be simplified.

(9) In the printed wiring board according to any one of the above (1) to (8), the wiring line may include a portion where a value obtained by dividing a height of the wiring line by a width of the wiring line is 2 or more.

According to the printed wiring board of the above (9), even when the height of the wiring line is large, filling of an adhesive or application of a solder resist can be easily performed.

(10) In the printed wiring board according to any one of the above (1) to (9), the groove may include a first groove portion and a second groove portion adjacent to each other with a space between the first groove portion and the second groove portion. The wiring line may include a first portion disposed in the first groove portion and a second portion disposed in the second groove portion. The wiring line may include a portion where a value obtained by dividing a height of the wiring line by the space between the first portion and the second portion is 2 or more.

According to the printed wiring board of the above (10), since a resist is not used for forming the wiring line, the collapse of the resist does not occur even when the height of the wiring line is large and the space between the portions of the adjacent wiring lines is small.

(11) In the printed wiring board according to any one of the above (1) to (10), the base film may be made of a polyimide.

According to the printed wiring board of the above (11), it is possible to increase a heat resistance of the base film. The printed wiring board of the above (11) can withstand a thermal load when a component is mounted by soldering or the like, because the heat resistance of the base film is enhanced.

(12) In the printed wiring board according to any one of the above (1) to (11), the base film may further have a second major surface, the second major surface being a surface opposite to the first major surface. A width of the groove may decrease in a direction from the first major surface toward the second major surface.

(13) The printed wiring board of any one of the above (1) to (12) may further include: an adhesive covering the first major surface, the adhesive being provided in the groove to cover the wiring line; and a coverlay attached to the first major surface with the adhesive.

(14) The printed wiring board of any one of the above (1) to (12) may further include a solder resist covering the first major surface, the solder resist being provided in the groove to cover the wiring line.

Detailed Description of Embodiments

The details of embodiments of the present disclosure will now be described with reference to the drawings. In the drawings, the same or corresponding portions are denoted by the same reference numerals, and the description thereof will not be repeated. A printed wiring board according to an embodiment of the present disclosure is referred to as a printed wiring board 100.

(Configuration of Printed Wiring Board 100)

The configuration of printed wiring board 100 will be described below.

FIG. 1 is a cross-sectional view of printed wiring board 100. As shown in FIG. 1, printed wiring board 100 includes a base film 10 and a wiring line 20.

Base film 10 has a first major surface 10a and a second major surface 10b. First major surface 10a and second major surface 10b are end surfaces of base film 10 in a thickness direction. Second major surface 10b is a surface opposite to first major surface 10a.

Grooves 10c are formed in first major surface 10a. Groove 10c extends toward second major surface 10b in a cross-sectional view. Groove 10c has a bottom surface 10ca, a side surface 10cb and a side surface 10cc. Side surface 10cb and side surface 10cc are opposed to each other with a space therebetween. Bottom surface 10ca is connected to a lower end of side surface 10cb and a lower end of side surface 10cc.

It is preferable that a width of groove 10c decreases in a direction from first major surface 10a toward second major surface 10b. From another viewpoint, it is preferable that the space between side surface 10cb and side surface 10cc decreases in the direction from first major surface 10a toward second major surface 10b. In FIG. 1, bottom surface 10ca is linear in a cross-sectional view, but bottom surface 10ca may be curved to be convex toward second major surface 10b in a cross-sectional view. Further, a corner portion of groove 10c where bottom surface 10ca and side surface 10cb are connected and a corner portion of groove 10c where bottom surface 10ca and side surface 10cc are connected may be curved in a cross-sectional view.

Base film 10 is made of a flexible electrically insulating material. Base film 10 is preferably made of a polyimide. Base film 10 may be made of polyethylene terephthalate, polyethylene naphthalate, or the like.

Wiring line 20 is disposed in groove 10c. Wiring line 20 includes a metal particle layer 21 and a plating layer 22. Plating layer 22 includes an electroless plating layer 23 and an electrolytic plating layer 24.

A height of wiring line 20 is represented by a height H. Height His the maximum value of a distance between a top surface of wiring line 20 and bottom surface 10ca. A width of wiring line 20 is represented by a width W. Width W is measured at a position where the width of wiring line 20 is maximized in a height direction of wiring line 20. Height H may be larger than width W. Further, height H may be equal to or less than width W. As will be described later, from the viewpoint of a filling property of an adhesive 30 and the viewpoint of a countermeasure against a collapse of a resist, the value obtained by dividing height H by width W can be set to 2 or more. However, the value obtained by dividing height H by width W may not be 2 or more in all the portions of wiring line 20. The value obtained by dividing height H by width W may be 2 or more in at least a part of wiring line 20.

A space between the portions of adjacent wiring lines 20 is referred to as a space SP. Space SP is measured at a position where the space between the portions of adjacent wiring lines 20 in the height direction of wiring line 20 is minimized. Height H may be larger than space SP. Height H may be equal to or less than space SP. As will be described later, from the viewpoint of the filling property of adhesive 30 and the viewpoint of the countermeasure against the collapse of the resist, the value obtained by dividing height H by space SP can be set to 2 or more. However, the value obtained by dividing height H by space SP may not be 2 or more in all the portions of wiring line 20. The value obtained by dividing height H by space SP may be 2 or more in at least a part of wiring line 20.

Figure 2:
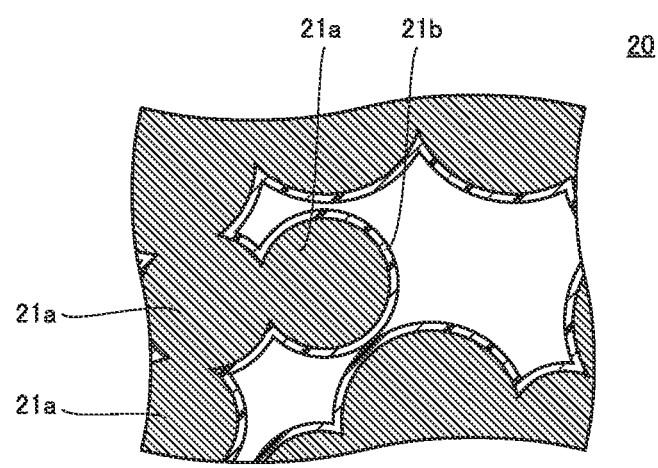
FIG. 2 is a schematic enlarged view of a metal particle layer 21.

Metal particle layer 21 is disposed on bottom surface 10ca, side surface 10cb, and side surface 10cc. A thickness of metal particle layer 21 is preferably 1 nm to 4000 nm from the viewpoint of ensuring the oxidation suppressing function of metal particle layer 21 and from the viewpoint of inhibiting metal particle layer 21 from becoming excessively thick. The thickness of metal particle layer 21 is more preferably 30 nm to 3000 nm. FIG. 2 is a schematic enlarged view of metal particle layer 21. As shown in FIG. 2, metal particle layer 21 has a plurality of metal particles 21a. The plurality of metal particles 21a are bonded to each other by metallic bonding. Metal particle 21a is made of, for example, copper. Metal particle 21a may be made of silver.

When a particle diameter of metal particle 21a is too small, a surface energy becomes too large. On the other hand, when the particle diameter of metal particle 21a is too large, metal particle layer 21 becomes too porous. Therefore, a d50 of the plurality of metal particles 21a is preferably 1 nm to 500 nm. The d50 of the plurality of metal particles 21a is more preferably 30 nm to 200 nm.

The d50 of the plurality of metal particles 21a is measured by the following method. In the measurement of the d50 of the plurality of metal particles 21a, first, a distribution of crystal grain sizes of the plurality of metal particles 21a is measured by a laser diffractometry. In the measurement of the d50 of the plurality of metal particles 21a, second, the crystal grain size at which the volume-integrated value is 50% in the measured distribution of the crystal grain sizes of the plurality of metal particles 21a is calculated. The crystal grain size at which the volume-integrated value is 50% in the measured distribution of the crystal grain size of the plurality of metal particles 21a is the d50 of the plurality of metal particles 21a.

A part of a surface of metal particle 21a is coated with an organic film 21b. When a molecular weight of a polymeric material constituting organic film 21b is small, the oxidation suppressing function of organic film 21b may be insufficient. When the molecular weight of the polymeric material constituting organic film 21b is large, organic film 21b becomes bulky and metal particle layer 21 becomes porous. Therefore, organic film 21b is preferably made of the polymeric material having a number-average molecular weight (Mn) of 100 to 1000000. Organic film 21b may be the polymeric material having a polar group. The polar group is, for example, an amine, a carboxyl group, or a hydroxyl group. Specific examples of the polymeric material constituting organic film 21b include amine-based polymeric materials such as polyethyleneimine, an ethylene oxide adduct of polyethyleneimine, and polyvinylpyrrolidone; polymeric materials having a carboxyl group such as polyacrylic acid, carboxymethyl cellulose, and a styrene-maleic copolymer; and polymeric materials having a hydroxyl group such as polyvinyl alcohol. Further, another part of the surface of metal particle 21a is bonded to another metal particle 21a by metallic bonding.

Plating layer 22 is a layer formed by plating. As shown in FIG. 1, plating layer 22 is disposed on metal particle layer 21. More specifically, plating layer 22 is provided in groove 10c, and metal particle layer 21 is interposed between plating layer 22 and bottom surface 10ca, side surface 10cb, and side surface 10cc of groove 10c. Plating layer 22 may be deposited in the gaps between metal particles 21a in metal particle layer 21 in addition to on metal particle layer 21.

Electroless plating layer 23 is disposed on metal particle layer 21. Electroless plating layer 23 is a layer formed by electroless plating. Electroless plating layer 23 is made of, for example, copper. Electrolytic plating layer 24 is disposed on electroless plating layer 23. Electrolytic plating layer 24 is a layer formed by electrolytic plating. Electrolytic plating layer 24 is made of, for example, copper.

Printed wiring board 100 further includes adhesive 30 and a coverlay 40. Adhesive 30 covers first major surface 10a. Further, adhesive 30 is provided in groove 10c to cover wiring line 20. Adhesive 30 is, for example, an epoxy-based adhesive. Coverlay 40 is attached to first major surface 10a with adhesive 30. Coverlay 40 is made of, for example, polyimide.

Figure 3:
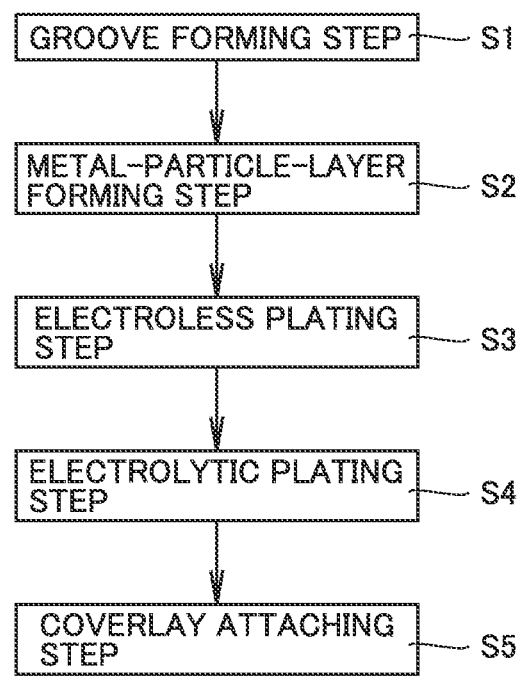
FIG. 3 is a step diagram showing a method of manufacturing a printed wiring board 100.

Hereinafter, a method of manufacturing printed wiring board 100 will be described FIG. 3 is a step diagram showing a method of manufacturing printed wiring board 100. As shown in FIG. 3, the method of manufacturing printed wiring board 100 includes a groove forming step S1, a metal-particle-layer forming step S2, an electroless plating step S3, an electrolytic plating step S4, and a coverlay attaching step S5.

Figure 4:
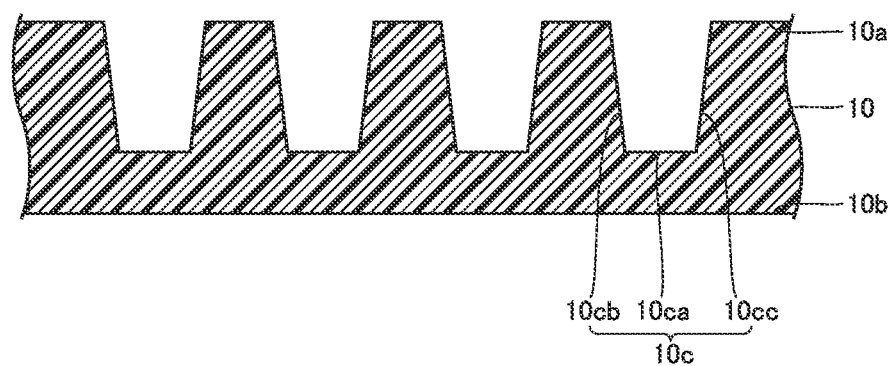
FIG. 4 is a cross-sectional view for explaining a groove forming step S1.

FIG. 4 is a cross-sectional view for explaining groove forming step S1. As shown in FIG. 4, in groove forming step S1, groove 10c is formed. Groove 10c is formed by irradiating first major surface 10a with a laser. By appropriately adjusting a laser irradiation condition, the width of groove 10c decreases in a direction from first major surface 10a toward second major surface 10b.

Figure 5:
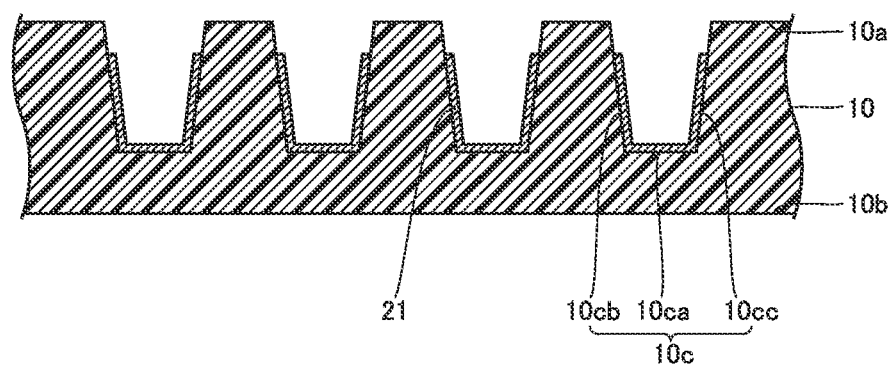
FIG. 5 is a cross-sectional view for explaining a metal-particle-layer forming step S2.

FIG. 5 is a cross-sectional view for explaining metal-particle-layer forming step S2. As shown in FIG. 5, in metal-particle-layer forming step S2, metal particle layer 21 is formed. In the formation of metal particle layer 21, first, ink containing metal particles 21a is applied onto bottom surface 10ca, side surface 10cb, and side surface 10cc.

The surface of metal particle 21a in the ink is entirely coated with organic film 21b. Therefore, in the ink, metal particles 21a are not bonded to each other by metallic bonding. The ink adhered to the portion of first major surface 10a where groove 10c is not formed is removed.

In the formation of metal particle layer 21, second, the solvent in the ink and a part of organic film 21b coating the surface of metal particle 21a are volatilized by heating. Accordingly, an exposed surface of metal particle 21a directly contacts another metal particle 21a to be metallically bonded, thereby forming metal particle layer 21.

Figure 6:
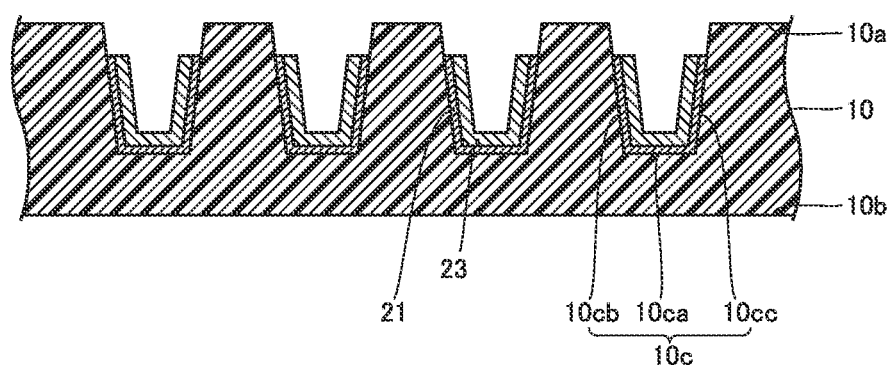
FIG. 6 is a cross-sectional view for explaining an electroless plating step S3.

FIG. 6 is a cross-sectional view for explaining electroless plating step S3. As shown in FIG. 6, in electroless plating step S3, electroless plating layer 23 is formed. The formation of electroless plating layer 23 is performed by immersing base film 10 on which metal particle layer 21 is formed in a plating solution containing a constituent material of electroless plating layer 23. Further, since the electroless plating is performed without using a catalyst such as palladium particles, electroless plating layer 23 is not formed anywhere other than on metal particle layer 21.

Figure 7:
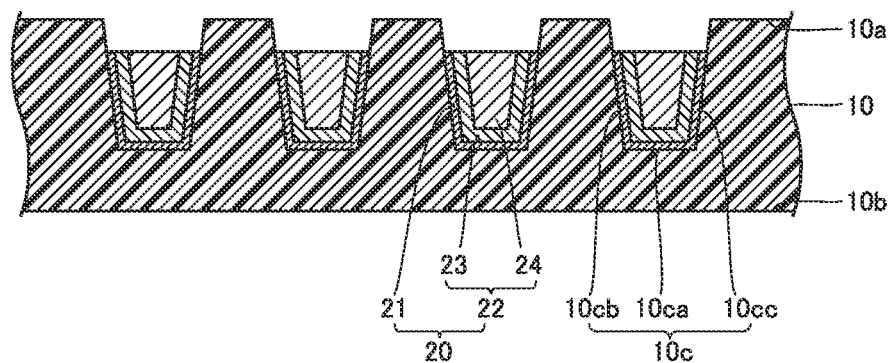
FIG. 7 is a cross-sectional view for explaining an electrolytic plating step S4.

FIG. 7 is a cross-sectional view for explaining electrolytic plating step S4. In electrolytic plating step S4, as shown in FIG. 7, electrolytic plating layer 24 is formed. Electrolytic plating layer 24 is formed by immersing the base film on which metal particle layer 21 and electroless plating layer 23 are formed in a plating solution containing a constituent material of electrolytic plating layer 24 and applying a current to metal particle layer 21 and electroless plating layer 23.

In coverlay attaching step S5, coverlay 40 is attached using adhesive 30. In coverlay attaching step S5, first, coverlay 40 to which uncured adhesive 30 is applied is disposed on first major surface 10a. As a result, uncured adhesive 30 covers first major surface 10a. Further, uncured adhesive 30 is provided in groove 10c so as to cover wiring line 20.

Second, coverlay 40 is attached to first major surface 10a. This attachment is performed by pressing coverlay 40 toward first major surface 10a while heating. In this way, printed wiring board 100 having the structure shown in FIG. 1 is manufactured.

(Effects of Printed Wiring Board 100)

The effects of printed wiring board 100 will be described below.

In printed wiring board 100, oxygen may diffuse in base film 10 and reach an interface between wiring line 20 and groove 10c. This diffusion of oxygen is particularly significant when base film 10 is made of a material such as polyimide in which oxygen is easily diffused. However, in printed wiring board 100, there is metal particle layer 21 at the interface between wiring line 20 and groove 10c.

In metal particle layer 21, the surface of metal particle 21a is partially coated with organic film 21b. Therefore, in printed wiring board 100, even when oxygen diffuses in base film 10, wiring line 20 is less likely to be oxidized at the interface with groove 10c. As a result, according to printed wiring board 100, wiring line 20 is prevented from being peeled off from groove 10c. When metal particle 21a is made of silver, metal particle layer 21 is further less likely to be oxidized, and thus wiring line 20 is further less likely to be oxidized at the interface with groove 10c.

Figure 8:
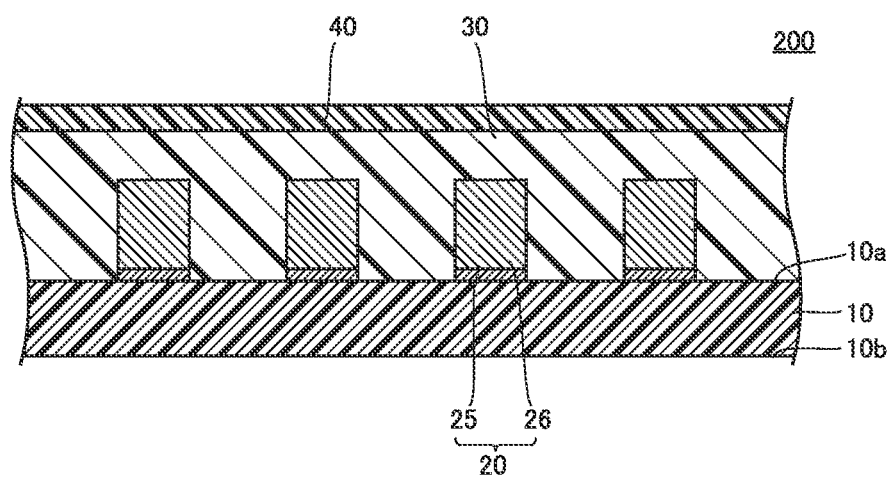
FIG. 8 is a cross-sectional view of a printed wiring board 200.

A printed wiring board according to a comparative example is referred to as a printed wiring board 200. FIG. 8 is a cross-sectional view of printed wiring board 200. As shown in FIG. 8, printed wiring board 200 includes base film 10, wiring line 20, adhesive 30, and coverlay 40.

In printed wiring board 200, groove 10c is not formed in first major surface 10a. In printed wiring board 200, wiring line 20 includes a seed layer 25 and an electrolytic plating layer 26. Seed layer 25 is disposed on first major surface 10a. Electrolytic plating layer 26 is disposed on seed layer 25.

In printed wiring board 200, adhesive 30 is disposed on first major surface 10a so as to cover wiring line 20, and coverlay 40 is attached by adhesive 30.

Printed wiring board 200 is manufactured by a semi-additive process. More specifically, first, a resist is formed on seed layer 25. The resist is formed by exposure and development of a dry film resist or the like. Second, electrolytic plating is performed on seed layer 25 exposed from an opening of the resist, thereby forming electrolytic plating layer 26. Third, the resist is removed.

In printed wiring board 200, when height H is large (more specifically, when height H is two times or more than width W or when height H is two times or more than space SP), it is difficult to fill adhesive 30 between the portions of adjacent wiring lines 20. On the other hand, in printed wiring board 100, since wiring line 20 is disposed in groove 10c, even when height H is large, a problem is unlikely to occur in filling adhesive 30.

Further, in printed wiring board 200, when height H is large and space SP is small (more specifically, when a value obtained by dividing height H by space SP is 2 or more), a width of the resist used for forming electrolytic plating layer 26 is small, and a height of the resist is large. Therefore, in printed wiring board 200, when wiring line 20 having large height H and small space SP is formed, the resist may fall.

On the other hand, in printed wiring board 100, since the resist is not used to form wiring line 20, it is not necessary to consider the fall of the resist when forming wiring line 20 having large height H and small space SP.

First Modification

Figure 9:
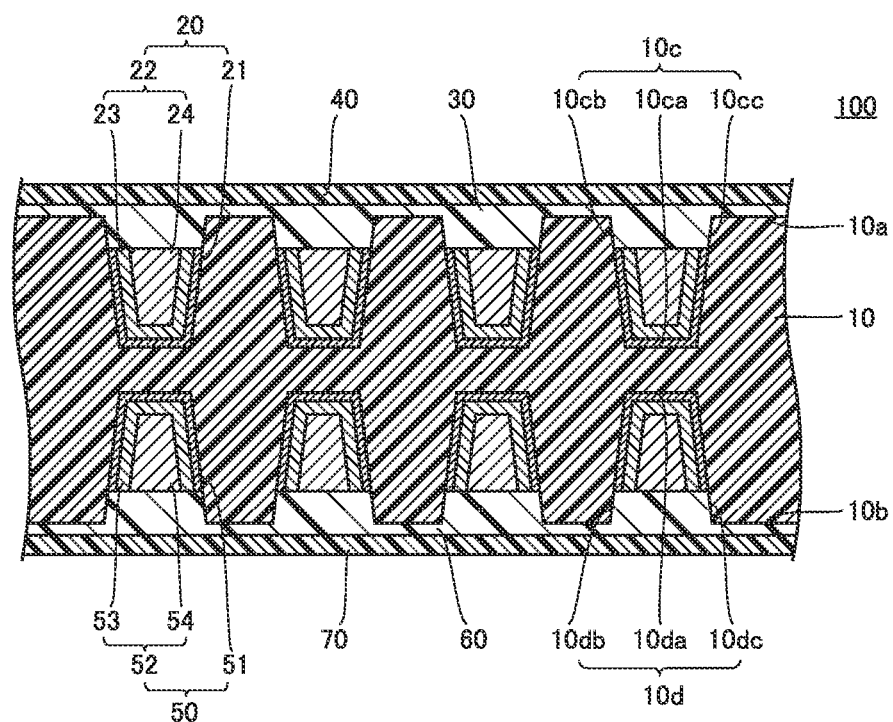
FIG. 9 is a cross-sectional view of a printed wiring board 100 according to a first modification.

FIG. 9 is a cross-sectional view of printed wiring board 100 according to a first modification. As shown in FIG. 9, grooves 10d may be formed in second major surface 10b. Groove 10d extends toward first major surface 10a in a cross-sectional view. Groove 10d has a bottom surface 10da, a side surface 10db, and a side surface 10dc. Side surface 10db and side surface 10dc are opposed to each other with a space therebetween. A lower end of side surface 10db and a lower end of side surface 10dc are connected to bottom surface 10da. Although grooves 10d are formed at positions overlapping grooves 10c in plan view in FIG. 9, grooves 10d may be formed at positions not overlapping grooves 10c in plan view.

A wiring line 50 is disposed in groove 10d. Wiring line 50 includes a metal particle layer 51 and a plating layer 52. Plating layer 52 includes an electroless plating layer 53 and an electrolytic plating layer 54. Metal particle layer 51 is disposed on bottom surface 10da, side surface 10db, and side surface 10dc. Electroless plating layer 53 is disposed on metal particle layer 51. Electrolytic plating layer 54 is disposed on electroless plating layer 53. Metal particle layer 51, electroless plating layer 53, and electrolytic plating layer 54 have configurations similar to metal particle layer 21, electroless plating layer 23, and electrolytic plating layer 24, respectively.

Printed wiring board 100 may further include an adhesive 60 and a coverlay 70. Adhesive 60 covers second major surface 10b. Further, adhesive 60 fills groove 10d in such a manner as to cover wiring line 50. Coverlay 70 is attached to second major surface 10b with adhesive 60. Adhesive 60 and coverlay 70 have configurations similar to adhesive 30 and coverlay 40, respectively.

Second Modification

Figure 10:
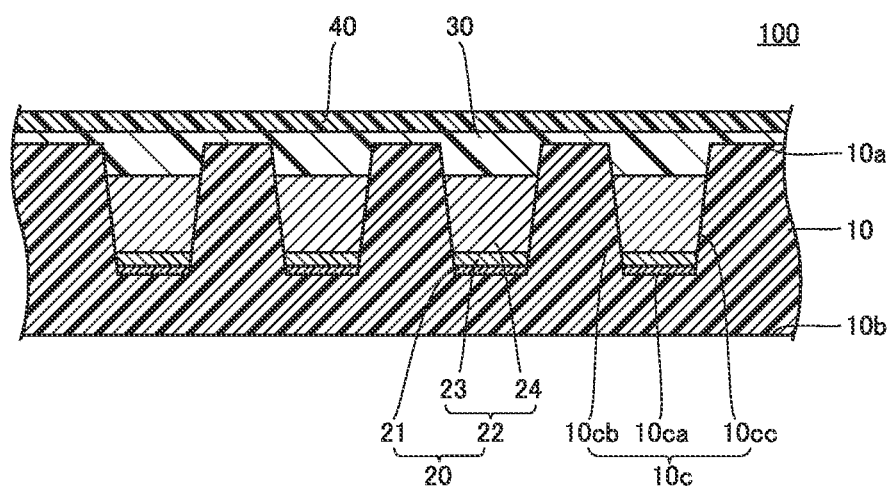
FIG. 10 is a cross-sectional view of a printed wiring board 100 according to a second modification.

FIG. 10 is a cross-sectional view of printed wiring board 100 according to a second modification. As shown in FIG. 10, metal particle layer 21 is disposed only on bottom surface 10ca, and may not be disposed on side surface 10cb and side surface 10cc.

Third Modification

Figure 11:
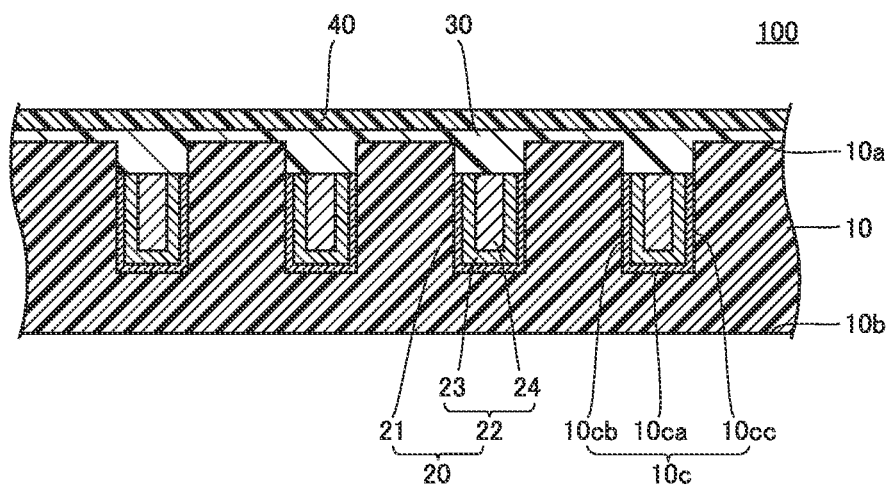
FIG. 11 is a cross-sectional view of a printed wiring board 100 according to a third modification.

FIG. 11 is a cross-sectional view of printed wiring board 100 according to a third modification. As shown in FIG. 11, a width of groove 10d may be constant in a thickness direction of base film 10.

Fourth Modification

Figure 12:
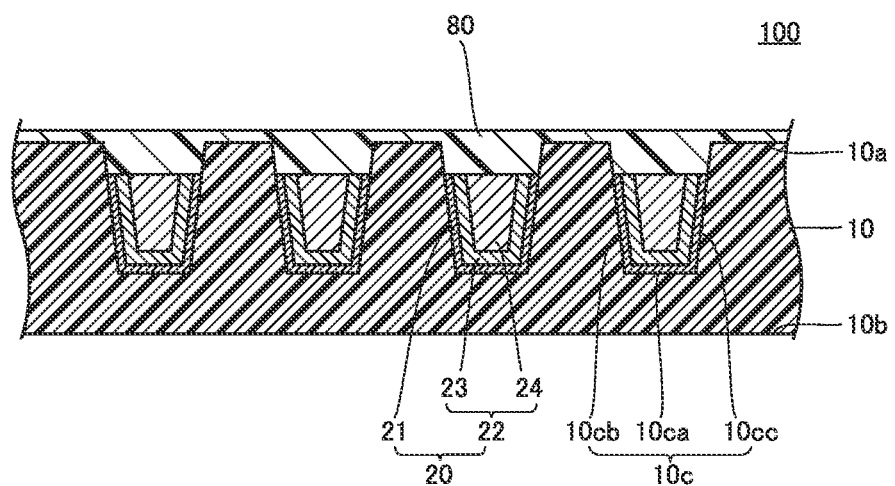
FIG. 12 is a cross-sectional view of a printed wiring board 100 according to a fourth modification.

FIG. 12 is a cross-sectional view of printed wiring board 100 according to a fourth modification. As shown in FIG. 12, printed wiring board 100 may have a solder resist 80 instead of adhesive 30 and coverlay 40. Solder resist 80 covers first major surface 10a. Solder resist 80 is provided in groove 10c to cover wiring line 20.

Fifth Modification

Figure 13:
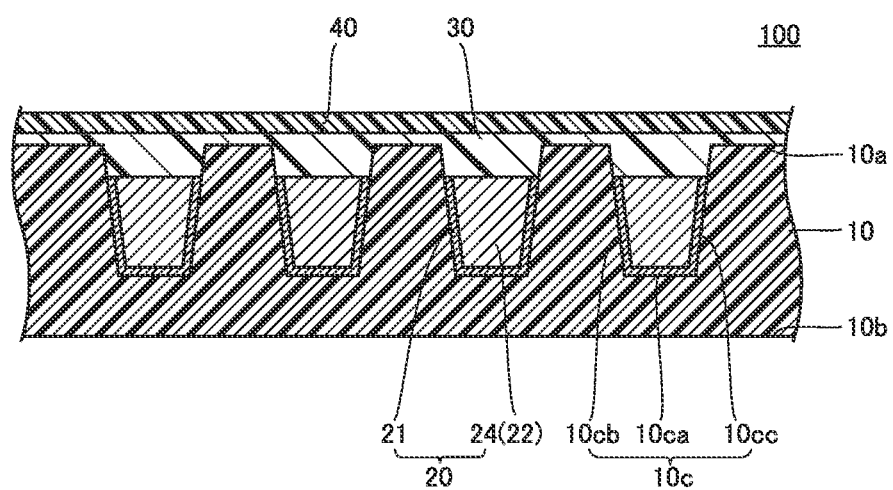
FIG. 13 is a cross-sectional view of a printed wiring board 100 according to a fifth modification.

FIG. 13 is a cross-sectional view of printed wiring board 100 according to a fifth modification. As shown in FIG. 13, plating layer 22 may include only electrolytic plating layer 24. That is, plating layer 22 does not include electroless plating layer 23. In this case, electrolytic plating layer 24 is disposed on metal particle layer 21. In this case, electroless plating step S3 may be omitted, and thus the manufacturing steps of printed wiring board 100 can be simplified.

Sixth Modification and Seventh Modification

Figure 14:
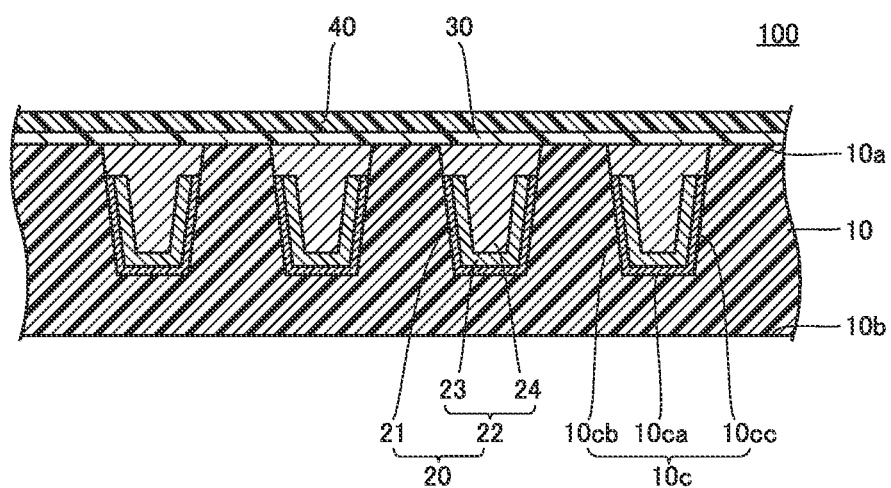
FIG. 14 is a cross-sectional view of a printed wiring board 100 according to a sixth modification.

FIG. 14 is a cross-sectional view of printed wiring board 100 according to a sixth modification. As shown in FIG. 14, a top surface of wiring line 20 (a top surface of electrolytic plating layer 24) may be flush with first major surface 10a.

Figure 15:
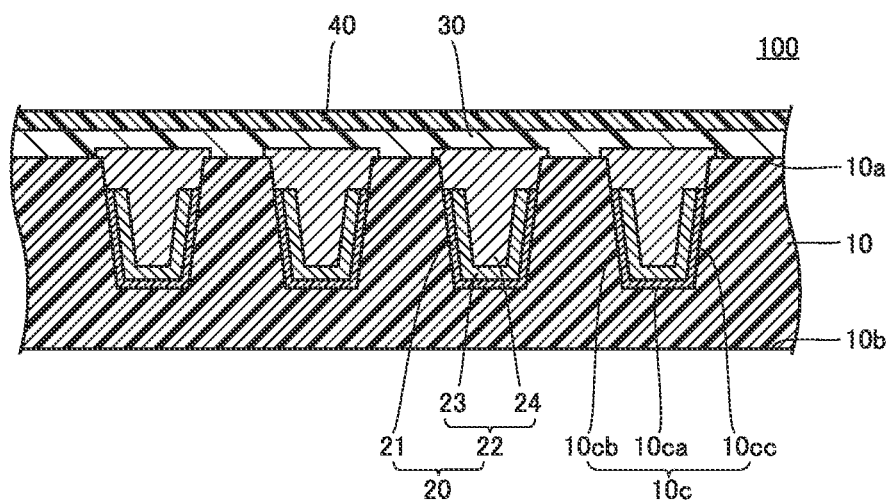
FIG. 15 is a cross-sectional view of a printed wiring board 100 according to a seventh modification.

FIG. 15 is a cross-sectional view of printed wiring board 100 according to a seventh modification. As shown in FIG. 15, a top surface of wiring line 20 (a top surface of electrolytic plating layer 24) may be located at a position protruding from first major surface 10a. A maximum value of a thickness of wiring line 20 (electrolytic plating layer 24) protruding from first major surface 10a may be smaller than space SP in order to suppress adjacent wiring lines 20 from being short-circuited.

EXAMPLES

As samples of the printed wiring board, sample 1 and sample 2 were prepared. Sample 1 corresponds to printed wiring board 100.

In sample 1, a width and depth of groove 10c were set to 25 μm and 60 μm, respectively, and a space between the portions of adjacent grooves 10c was set to 25 μm. A thickness of metal particle layer 21 was set to 280 nm and a thickness of electroless plating layer 23 was set to 340 nm. In sample 1, electrolytic plating layer 24 was formed so that a distance between electrolytic plating layer 24 and first major surface 10a was 2 μm. In sample 1, base film 10 was made of UPILEX-S (polyimide) manufactured by Ube Industries, Ltd., and a thickness of base film 10 was set to 125 μm.

Sample 1 was prepared by performing groove forming step S1, metal-particle-layer forming step S2, electroless plating step S3, and electrolytic plating step S4. In groove forming step S1, groove 10c was formed by laser processing under the conditions of a beam moving speed of 350 mm/sec, a power of 0.5 W, and a number of rotations of 3. After groove forming step S1, a plasma treatment was performed on base film 10 under the following conditions: a linear speed of 2 m/sec, a mixture gas of oxygen and tetrafluoromethane (flow rate of oxygen: 200 sccm, flow rate of tetrafluoromethane. 20 sccm), a chamber internal pressure of 80 Pa, a plasma power of 500 W, and a treatment time of 7 seconds.

In metal-particle-layer forming step S2, an ink containing 26% by mass of copper particles having a particle size of 80 nm and having a surface coated with an organic film having a molecular weight of 70000 was used. The ink was applied by a bar coating method using a flat bar. A linear speed during coating was set to 0.5 m/min. After the formation of metal particle layer 21, the ink adhered to the portions of first major surface 10a where grooves 10c were not formed was removed by being immersed in an aqueous sodium persulfate solution at 25° C. for 30 seconds. After the removal, water washing for 30 seconds was performed three times, and drying was performed by air drying. The ink was baked in a nitrogen gas atmosphere with a 10 ppm oxygen content under the conditions of a baking temperature of 350° C., and a holding time of 2 hours.

Electroless plating step S3 was performed under the conditions of a liquid temperature of 31° C. and a plating time of 8 minutes. Electrolytic plating step S4 was performed for 5 minutes under the condition of a current density of 0.5 A/dm$^2$, and for 45 minutes under the condition of a current density of 1 A/dm$^2$.

Sample 2 is the same as sample 1 except that metal particle layer 21 is not provided. However, in sample 2, a thickness of electroless plating layer 23 was set to 600 nm. Sample 2 was prepared in a manner similar to sample 1. However, metal-particle-layer forming step S2 was not performed on sample 2.

The reliability of samples 1 and 2 was evaluated by holding the samples at 150° C. for 7 days and then performing a tape peeling test to observe whether or not wiring line 20 was peeled off. No peeling occurred in sample 1, whereas wiring line 20 peeled off in sample 2. From this comparison, it has been experimentally revealed that, according to printed wiring board 100 having metal particle layer 21, even if oxygen diffuses in base film 10, wiring line 20 is hardly oxidized at the interface with groove 10c, and wiring line 20 is hardly peeled off from groove 10c.

The embodiments disclosed herein are illustrative in all respects and should not be construed as limiting. The scope of the present invention is defined by the claims rather than the foregoing embodiments, and is intended to include all modifications within the scope and meaning equivalent to the claims.

REFERENCE SIGNS LIST 10 base film, 10a first major surface, 10b second major surface, 10c groove, 10ca bottom surface, 10cb, 10cc side surface, 10d groove, 10da bottom surface, 10db, 10dc side surface, 20 wiring line, 21 metal particle layer, 21a metal particle, 21b organic film, 22 plating layer, 23 electroless plating layer, 24 electrolytic plating layer, 25 seed layer, 26 electrolytic plating layer, 30 adhesive, 40 coverlay, 50 wiring line, 51 metal particle layer, 52 plating layer, 53 electroless plating layer, 54 electrolytic plating layer, 60 adhesive, 70 coverlay, 80 solder resist, 100, 200 printed wiring board, H height, S1 groove forming step, S2 metal-particle-layer forming step, S3 electroless plating step, S4 electrolytic plating step, S5 coverlay attaching step, SP space, W width.

The invention claimed is:

1. A printed wiring board comprising:
a base film having a first major surface provided with a groove; and
a wiring line disposed in the groove,
wherein the wiring line includes a metal particle layer disposed at least on a bottom surface of the groove and a plating layer disposed on the metal particle layer,
wherein the metal particle layer contains a plurality of metal particles bonded to each other by metallic bonding, and
wherein a surface of each of the plurality of metal particles is partially coated with an organic film.

2. The printed wiring board according to claim 1, wherein the metal particle layer is disposed on the bottom surface of the groove and a side surface of the groove.

3. The printed wiring board according to claim 1, wherein the plurality of metal particles are made of copper.

4. The printed wiring board according to claim 1, wherein the plurality of metal particles are made of silver.

5. The printed wiring board according to claim 1, wherein the organic film is made of a polymeric material having a number-average molecular weight of 100 to 1000000.

6. The printed wiring board according to claim 1, wherein a d50 of the plurality of metal particles is 1 nm to 500 nm.

7. The printed wiring board according to claim 1, wherein the plating layer includes an electroless plating layer disposed on the metal particle layer and an electrolytic plating layer disposed on the electroless plating layer.

8. The printed wiring board according to claim 1, wherein the plating layer includes an electrolytic plating layer disposed on the metal particle layer.

9. The printed wiring board according to claim 1, wherein the wiring line includes a portion where a value obtained by dividing a height of the wiring line by a width of the wiring line is 2 or more.

10. The printed wiring board according to claim 1, wherein the groove includes a first groove portion and a second groove portion adjacent to each other with a space between the first groove portion and the second groove portion, wherein the wiring line includes a first portion disposed in the first groove portion and a second portion disposed in the second groove portion, and wherein the wiring line includes a portion where a value obtained by dividing a height of the wiring line by the space between the first portion and the second portion is 2 or more.

11. The printed wiring board according to claim 1, wherein the base film is made of a polyimide.

12. The printed wiring board according to claim 1, wherein the base film further has a second major surface, the second major surface being a surface opposite to the first major surface, and wherein a width of the groove decreases in a direction from the first major surface toward the second major surface.

13. The printed wiring board according to claim 1, further comprising:
    an adhesive covering the first major surface, the adhesive being provided in the groove to cover the wiring line; and
    a coverlay attached to the first major surface with the adhesive.

14. The printed wiring board according to claim 1, further comprising:
    a solder resist covering the first major surface, the solder resist being provided in the groove to cover the wiring line.

* * * * *